(12) United States Patent
Oh et al.

(10) Patent No.: US 7,169,332 B2
(45) Date of Patent: Jan. 30, 2007

(54) INSULATED CONDUCTIVE BALL FOR ANISOTROPIC CONDUCTIVE CONNECTION, METHOD OF PREPARING THE SAME, AND PRODUCT USING THE SAME

(75) Inventors: Joo-Seok Oh, Daejeon (KR); Sang-Hun Lee, Daejeon (KR); Jeong-Deok Seo, Daejeon (KR); Kee-Ho Chang, Daejeon (KR); Jeong-Teck Rim, Daejeon (KR)

(73) Assignee: Hanwha Chemical Corporation, Seoul (KR)

(*) Notice: Subject to any disclaimer, the term of this patent is extended or adjusted under 35 U.S.C. 154(b) by 453 days.

(21) Appl. No.: 10/841,861

(22) Filed: May 6, 2004

(65) Prior Publication Data
US 2004/0222523 A1 Nov. 11, 2004

(30) Foreign Application Priority Data
May 6, 2003 (KR) .............. 10-2003-0028727

(51) Int. Cl.
*H01B 1/22* (2006.01)
*B05D 5/12* (2006.01)
*B32B 5/16* (2006.01)

(52) U.S. Cl. ............... 252/512; 252/514; 427/180; 427/210; 428/403

(58) Field of Classification Search ........... 252/512, 252/513, 514; 428/403; 427/180, 210; 438/119; 439/91
See application file for complete search history.

(56) References Cited

U.S. PATENT DOCUMENTS
5,162,087 A * 11/1992 Fukuzawa et al. .......... 252/500

FOREIGN PATENT DOCUMENTS
| JP | 08-335407 | | 12/1996 |
| JP | 2005-148165 | * | 6/2005 |
| KR | 20010060234 A | | 7/2001 |

* cited by examiner

*Primary Examiner*—Mark Kopec
(74) *Attorney, Agent, or Firm*—Fish & Neave IP Group, Ropes & Gray LLP

(57) ABSTRACT

Disclosed is an insulated conductive ball for anisotropic conductive connection, a method of preparing the same and a product using the same. The insulated conductive ball includes a conductive ball, and an insulating resin layer coated on a surface of the conductive ball, in which the insulating resin layer is formed of water-soluble resin beads of core/shell structure. Therefore, the conductive ball of the current invention can exhibit superior current feed and insulation characteristics, compared to those of conventional insulated conductive balls for anisotropic conductive connection coated with thermoplastic resin or thermosetting resin.

10 Claims, 1 Drawing Sheet

INSULATED CONDUCTIVE BALL FOR ANISOTROPIC CONDUCTIVE CONNECTION, METHOD OF PREPARING THE SAME, AND PRODUCT USING THE SAME

CROSS REFERENCES TO OTHER APPLICATIONS

This application claims priority to the earlier filed Korean Patent Application No.10-2003-0028727, filed 6 May 2003, and having Joo-Seok Oh, Sang-Hun Lee, Jeong-Deok Seo, Kee-Ho Chang, and Jeong Teck Rim as inventors, the contents of which are hereby incorporated by reference.

TECHNICAL FIELD

The present invention relates, in general, to insulated conductive balls for anisotropic conductive connection, preparation methods thereof and products using the same. More specifically, the present invention relates to an insulated conductive ball for anisotropic conductive connection, characterized in that an insulating resin layer is formed of water-soluble resin beads of core/shell structure even though being coated on the conductive ball, and thus, the insulated conductive ball of the present invention has superior current feed and insulation characteristics, compared to those of conventional conductive balls for anisotropic conductive connection coated with thermoplastic or thermosetting resins; a method of preparing the insulated conductive ball for anisotropic conductive connection; and a product using the insulated conductive ball for anisotropic conductive connection.

BACKGROUND ART

Generally, as electronic parts, such as semiconductors and substrates, have been manufactured to be smaller and thinner, circuits and connection terminals have become very dense and fine. Anisotropic conductive connections have been used in such circuits by dispersing fine conductive balls in an insulating adhesive to obtain a film- or paste-type anisotropic conductive connection material, which is then disposed between connection terminals, heated, and then compressed for adhesion.

Recently, as patterns of connection terminals useful as targets of anisotropic conductive connection become even finer, short circuits between neighboring terminals may occur at the anisotropic conductive connection. Therefore, it is preferable that the conductive balls for anisotropic conductive connection be coated with a thin thermoplastic resin layer or thermosetting resin layer.

However, presently developed insulated conductive balls have diverse problems. For example, when the insulating coating material includes a thermoplastic resin, the coating may be damaged by a solvent during the preparation of the anisotropic conductive connection material, thus preventing the desired insulation performance. Also, crosslinking density is difficult to control when the thermosetting resin is formed into a coating layer. A crosslinking density that is too low causes the same problems as using thermoplastic resins. A very high crosslinking density prevents the coating layer from being removed from the anisotroic connection, thereby preventing current feed between the electrodes.

Examples of the coating process include solution dipping, interfacial polymerization, in-situ polymerization, spray drying, vacuum deposition, physical and mechanical hybridization, etc. However, the above processes suffer from difficulties in forming a uniformly and sufficiently thick insulating coating layer. That is, it is difficult to coat a general resin on surfaces of particles to have a thickness of tens of to hundreds of nm. Japanese Patent Application No. Hei. 8-13076, discloses methods of coating particles with a resin layer, including interfacial polymerization, in-situ polymerization, spray drying, vacuum deposition, etc. In addition, Japanese Patent Application No. Sho. 62-71255 discloses a solution dipping method. However, the above methods do not allow an insulating resin layer having a uniform thickness of tens of to hundreds of nm or more to be easily formed. The method of Japanese Patent Application No. Hei. 8-13076 suffers from agglomeration of particles, and the method of Japanese Patent Application No. Sho. 62-71255 cannot readily form insulating resin layers having a thickness of hundreds of nm. Also, although Korean Patent Application No. 2001-060234 discloses a method of physically attaching crosslinked polymer particles onto conductive balls under gas atmosphere, this method is disadvantageous because it yields a non-uniform coating and weak bonds of particles, resulting in decreased mechanical strength and solvent resistance.

As for the conductive balls coated with thermoplastic resin, the thermoplastic resin film may be damaged by the solvent used for preparation of the anisotropic conductive connection material. Further, limitations are imposed on usable solvent types and mixing compositions. Also, use of the solvent negatively affects the environment including humans.

In addition, processes that include heating and compressing the anisotropic conductive connection cause the coating film to be softened and easily displaced, hence generating a short circuit between the neighboring terminals. Furthermore, for reliable connection of fine circuits in recent years, materials having large quantities of small-sized conductive balls have been used for anisotropic conductive connections. In such cases, since the amount of the thermoplastic resin becomes higher in proportion to an increase in the numbers of conductive balls in the anisotropic conductive connection material, the anisotropic conductive connection material decreases in heat resistance. As the interval between electrode terminals narrows, softened conductive balls are more likely to agglomerate, thereby leading to degraded insulation characteristics.

For conductive balls coated with thermosetting resin, high pressure is applied to anisotropic conductive connection to break the insulating resin layer film of the conductive balls, thereby increasing the probability of electrode terminal damage. In addition, if all of the pieces of the broken film are not recovered, reliable current feed is unachievable.

To solve such problems, Sony Chemical Corp. has proposed the preparation of insulated conductive balls by coating crosslinked polymer particles having a predetermined degree of crosslinkage to conductive balls under gas atmosphere. However, the above preparation process is disadvantageous in terms of non-uniform coating process, and low adhesion between the metal layer and the insulating resin layer due to the use of the not completely crosslinked polymer coating layer. Further, a purifying process should be additionally performed after coating, attributed to inevitable generation of agglomerated particles.

SUMMARY

Leading to the present invention, the intensive and thorough research on insulated conductive balls for anisotropic conductive connection, carried out by the present inventors aiming to avoid the problems encountered in the related art, resulted in the finding that superior insulation characteristics can be exhibited when polymer beads of core/shell structure that are soluble or dispersible in water are used as insulating resins for coating the conductive ball.

Accordingly, an object of the present invention is to provide an insulated conductive ball for anisotropic conductive connection, which is advantageous in terms of superior current feed and insulation characteristics by coating a conductive ball with an insulating resin formed of core/shell structured polymer which is soluble or dispersible in water, compared to those of conventional conductive balls for anisotropic conductive connection coated with thermoplastic resin or thermosetting resin.

Another object of the present invention is to provide a method of preparing the insulated conductive ball for anisotropic conductive connection.

A further object of the present invention is to provide an anisotropic conductive connection material prepared by use of the insulated conductive ball.

Yet another object of the present invention is to provide a connection structure prepared by use of the anisotropic conductive connection material.

To achieve the above objects, the present invention provides an insulated conductive ball for anisotropic conductive connection, including a conductive ball and an insulating resin layer coated on a surface of the conductive ball, wherein the insulating resin layer is formed of water-soluble resin beads of core/shell structure.

Further, the present invention provides a method of preparing an insulated conductive ball for anisotropic conductive connection, including coating a conductive ball with a water-soluble resin of core/shell structure dissolved in water, to form an insulating resin layer on the conductive ball.

Furthermore, the present invention provides an anisotropic conductive connection material, composed of the insulated conductive ball for anisotropic conductive connection dispersed in an insulating adhesive.

In addition, the present invention provides a connection structure, composed of two target objects facing each other to be connected and the anisotropic conductive connection material disposed between the two target objects to connect them.

The present invention provides an insulated conductive ball for anisotropic conductive connection, a preparation method thereof and a product using the same., Although the insulated conductive ball of the present invention is coated with an insulating resin, since the insulating resin layer is formed of a water-soluble resin of core/shell structure, the above insulated conductive ball can exhibit superior current feed characteristics and insulation characteristics, compared to conventional conductive balls for anisotropic conductive connection coated with thermoplastic resin or thermosetting resin.

DESCRIPTION OF DRAWINGS

The above and other objects, features and other advantages of the present invention will be more clearly understood from the following detailed description taken in conjunction with the accompanying drawings, in which.

Based on the present invention, an insulated conductive ball for anisotropic conductive connection includes a conductive ball and an insulating resin layer coated on the conductive ball, in which the insulating resin layer is formed of multi-layered thermoplastic resin beads whose layers are closely packed to each other and then crosslinked.

The insulating resin layer of the present invention is prepared by adding the conductive balls to an aqueous emulsion or suspension of multi-layered beads, stirring to coat the conductive balls with resin, and then heating at predetermined temperatures.

Used in the present invention, an insulating material is high in adhesion with a metal layer, and thus, is easily formed into the uniform insulating layer. Therefore, the formed insulating layer has superior mechanical strength and is not separated from the conductive ball even under physical impacts. Furthermore, the insulating layer has high solvent resistance, and is not dissolved and not deformed upon the preparation of the anisotropic conductive connection material. When the anisotropic conductive connection process is performed by use of the thus insulated conductive balls-containing anisotropic conductive connection material, easy displacement of the insulating resin layer by heating and compressing allows the metal surface to be rapidly exposed. Thereby, a stable current feed between electrode terminals to be connected can be achieved.

Figure 1:
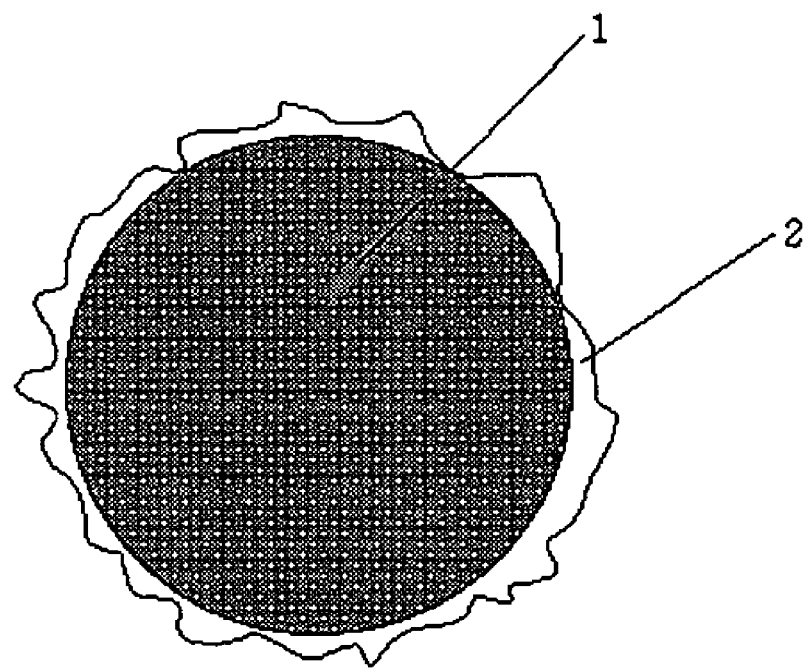
FIG. 1 is a schematic sectional view of an insulated conductive ball for anisotropic conductive connection, according to an illustrative embodiment of the present invention.

With reference to FIG. 1, there is shown an insulated conductive ball for anisotropic conductive connection of the present invention, including a conductive ball 1 and an insulating resin layer 2 coated on a surface of the conductive ball 1. The thickness (average thickness) of the insulating resin layer 2 is preferably not more than $\frac{1}{5}$ of the diameter of the conductive ball 1 within a range of 10 nm or more. When the ratio of thickness of the insulating resin layer to the diameter of the conductive ball is too large, current feed characteristics become poor. Meanwhile, if the above ratio is too small the connection provides inferior insulation characteristics. Generally, the conductive ball has the diameter of 2–10 μm.

The insulating layer is preferably mechanically strong and resistant to solvents and heat. The insulating resin layer preferably is stably maintained upon mechanical stirring and mixing for preparation of the anisotropic conductive connection material, and is resistant against slovents in the resin mixture. As such, examples of usable solvents include, without limitation, ketones, such as acetone, methylethylketone (MEK) and methylisobutylketone (MIBK), hydrocarbons, such as toluene, benzene and xylene, and industrial solvents, such as tetrahydrofuran (THF), dimethylformamide (DMF) and dimethylsulfoxide (DMSO).

Further, the insulating resin layer should not be displaced under zero pressure even though being heated. Otherwise, by the insulating resin layer displacing upon the anisotropic conductive connection, phase separation and agglomeration of the conductive balls may be caused. Consequently, since the metal layer is exposed due to the displacement of the insulating resin layer, the short circuit between the neighboring terminals may occur. Though, a softening temperature or glass transition temperature of the insulating resin layer should not be a great deal higher than the temperature of the anisotropic conductive connection process. This is because the resin should be softened so that the insulating resin layer is peeled off upon the connection process. The heating temperature for anisotropic conductive connection is preferably in the range of 120–210° C., although being different according to types of adhesives to be used.

Figure 2:
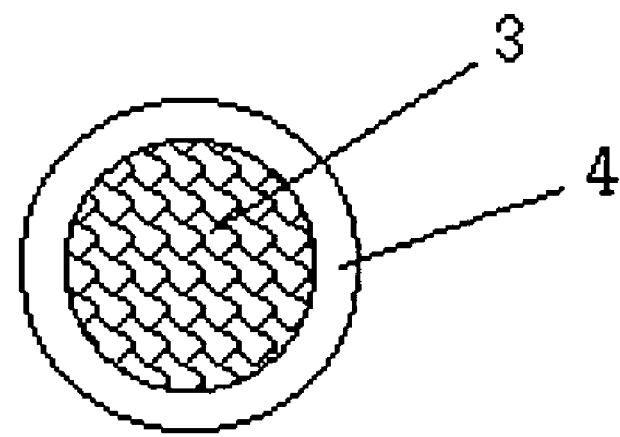
FIG. 2 is a schematic sectional view of an insulating resin layer, according to an illustrative embodiment of the present invention.

In the present invention, it is found that the insulating resin satisfying the above requirements is preferably composed of particles or emulsion resin particles having core/shell structures. For example, suitable resins may includestyrene-acryl copolymer resin. In certain embodiments, a styrene-acrylate copolymer constitutes a main component of a core 3, which is surrounded by a shell 4 of a styrene-acrylic acid copolymer, as shown in FIG. 2.

The core 3 of the core/shell beads acts to provide mechanical strength and heat resistance to the insulating layer, and the shell 4 functions to confer adhesion with metal. Further, the shell 4 is coated on the conductive ball and then forms a pseudo-crosslink or crosslink structure through a crosslink reaction accompanying hydrogen bond and dehydration with a shell of a neighboring conductive ball, thereby increasing the strength and solvent resistance of the insulating layer. Hence, the resin layer coated with styrene-acryl core/shell copolymer particles can exhibit high mechanical strength and superior solvent resistance, and also, is formed into an insulating layer having uniform thickness and morphology.

According to the present invention, an illustrative core includes a copolymer of styrene and 2-ethylhexylacrylate, having a molecular weight of 100,000–1,000,000, in consideration of mechanical strength and thermal stability after coating. The shell, for example is a copolymer of styrene and acrylic acid. To maintain coating and insulation properties, a weight ratio of core to shell is preferably in the range of 30–95:5–70. Further, to achieve better adhesion with the shell, a weight ratio of styrene to 2-ethylhexylacrylate of the core is preferably in the range of 1:0.3–2.

The water-soluble resin having core/shell structure preferably has a diameter of 20–200 nm, in view of insulation and current feed characteristics. Also, the insulating resin layer formed from the above water-soluble resin preferably has a glass transition temperature ranging from –30 to 150° C., in consideration of heat resistance in use, as well as process conditions of ACF (Anisotropic Conductive Film).

In the present invention, the beads having the core/shell structure are controlled in diameter of tens of to hundreds of nm, and hence, thickness of the insulating resin layer coated on the conductive balls can be easily adjusted.

Conventional conductive balls used for anisotropic conductive connections can be used as the conductive ball 1 to be coated by the insulating resin For example, the conductive balls can be, without limitation, metal balls, such as solder balls and nickel balls, and composite conductive balls having metal-plated resin.

The insulated conductive ball for anisotropic conductive connection of the present invention is prepared by adding the conductive ball 1 to the insulating resin emulsion, followed by slowly stirring at predetermined temperatures for predetermined hours and allowing to stand to form the insulating resin layer 2 on the conductive ball 1.

In addition, the insulated conductive balls for anisotropic conductive connection are dispersed in the insulating adhesive, whereby a paste- or film-type anisotropic conductive connection material can be prepared. Conventional anisotropic connection preparation adhesives can be used in this process.

The anisotropic conductive connection material using the insulated conductive balls of the present invention is disposed between two target objects (e.g., a semiconductor device and a substrate for mounting thereof, or a flexible wire substrate and a liquid crystal display) facing each other to be connected, and then heated and compressed, thereby obtaining a connection structure with high current feed characteristics, insulation characteristics, and connection strength.

A better understanding of the present invention may be obtained through the following examples which are set forth to illustrate, but are not to be construed as the limit of the present invention.

PREPARATIVE EXAMPLE 1

Preparation of Insulating Resin (Core/Shell Structured Resin)

Preparation of Shell (SAA Resin)

Into a 100 ml high-pressure reactor equipped with a stirrer, a first admixture of styrene (10.0 g), acrylic acid (10.0 g) and alpha-methyl styrene (10.0 g), and a second admixture of t-butylperoxybenzoate (1.2 g) and dipropyleneglycol methylether (3.0 g) were introduced and then heated to 200° C. This reaction mixture was stirred at the above temperature for 20 min, and then cooled at room temperature, to obtain a resultant reaction, which was then dried in a vacuum oven, to prepare a shell (SAA resin).

Preparation of Core/Shell Resin 15 g of the shell (SAA resin) was dissolved in 80 g of water-aqueous ammonia. As necessary, a heating process to about 90° C. was performed and the amount of aqueous ammonia was controlled to adjust the pH to about 9.0. 1.5 g of potassium persulfate was added to the solution, and the temperature of the solution was adjusted to 80° C. Then, a monomer mixture of styrene (20 g) and 2-ethylhexylacrylate (20 g) was slowly added to the the above solution through 2 hours with stirring. The resultant solution was further stirred at the same temperature for 1 hour, to obtain an emulsion solution dispersed with core/shell structured beads having diameters of about 70 nm.

PREPARATIVE EXAMPLE 2

Preparation of Insulating Resin

In a 100 ml round-bottom flask, styrene (10 g) and 2-ethylhexylacrylate (10 g) were mixed with toluene (50 g). To this mixture, 0.2 g of azoisobutyronitrile (AIBN) was added. The mixture was heated until the temperature of the mixture reached 70° C., followed by stirring for 24 hours. The resultant mixture was added dropwise to methanol, and the resulting precipitate was then dried under reduced pressure in a vacuum oven to prepare resin powders.

EXAMPLES 1–9

The insulating resin prepared in Preparative Example 1 was diluted with water to obtain an emulsion solution having 20% solid contents. Into the emulsion solution, conductive balls having divinylbenzene-acryl copolymer particles of diameters of 5 μm plated with Ni/Au were introduced, and then slowly stirred at 60° C. for 1 hour. Subsequently, the mixture was allowed to stand at room temperature for 20 min, after which the conductive balls were settled down and the emulsion layer was discarded. The settled conductive balls were washed once with each of water-ethanol and then ethanol, to wash off the resin beads not attached to the conductive balls. The resin-coated conductive balls were dried at 40° C. while being frequently stirred to prevent agglomeration thereof. The thus obtained insulated conductive balls for anisotropic conductive connection were analyzed with TGA, to confirm thickness of the insulating resin layer.

Each composition of insulated conductive balls for anisotropic conductive connection to be prepared according to the above procedures, a coating (%) of each insulating resin layer on the prepared conductive balls, and an average thickness (nm) of such an insulating resin layer, are summarized in Table 1, below.

TABLE 1

| Ex. No. | Water (g) | Insulating Resin (g) | Conductive Ball (g) | Coating (%) | Average Thick. (nm) |
|---|---|---|---|---|---|
| 1 | 100 | 1 | 5 | 80 | 32 |
| 2 | 100 | 10 | 1 | 96 | 85 |
| 3 | 100 | 20 | 1 | 99 | 178 |
| 4 | 100 | 50 | 1 | 100 | 375 |
| 5 | 100 | 10 | 2 | 90 | 146 |
| 6 | 100 | 20 | 2 | 95 | 227 |
| 7 | 100 | 50 | 2 | 98 | 192 |
| 8 | 100 | 10 | 3 | 83 | 145 |
| 9 | 100 | 50 | 3 | 95 | 252 |

COMPARATIVE EXAMPLES 1–9

The insulating resin prepared in Preparative Example 2 was dissolved in toluene. Conductive balls having divinylbenzene-acryl copolymer particles of diameters of 5 μm plated with Ni/Au were added to the solution, and then slowly stirred at 40° C. for 1 hour. Thereafter, the conductive balls were filtered, washed twice with ethanol, and then dried under reduced pressure in a vacuum oven. The obtained insulated conductive balls for anisotropic conductive connection were analyzed with TGA to confirm the thickness of the insulating resin layer.

Each composition of insulated conductive balls for anisotropic conductive connection to be prepared according to the above procedures, a coating (%) of each insulating resin layer on the prepared conductive balls, and an average thickness (nm) of such an insulating resin layer, are summarized in Table 2, below.

TABLE 2

| C. Ex. No. | Toluene (g) | Insulating Resin (g) | Conductive Ball (g) | Coating (%) | Average Thick. (nm) |
|---|---|---|---|---|---|
| 1 | 100 | 1 | 5 | 80 | NA |
| 2 | 100 | 10 | 1 | 96 | 8 |
| 3 | 100 | 20 | 1 | 99 | 10 |
| 4 | 100 | 50 | 1 | 100 | 26 |
| 5 | 100 | 10 | 2 | 90 | 14 |
| 6 | 100 | 20 | 2 | 95 | 19 |
| 7 | 100 | 50 | 2 | 98 | 21 |
| 8 | 100 | 10 | 3 | 83 | 14 |
| 9 | 100 | 50 | 3 | 95 | 23 |

The insulated conductive balls obtained in Examples and Comparative Examples were added to an admixture of 12 parts by weight of bisphenol-A solid epoxy resin (YDF-101, purchased from Kukdo Chemical Co. Ltd., Korea), 48 parts by weight of bisphenol-A liquid epoxy resin (YDF-128, purchased from Kukdo Chemical Co. Ltd., Korea), 40 parts by weight of a latent hardener (H-3842, purchased from Kukdo Chemical Co. Ltd., Korea) and 60 parts by weight of methylethylketone to have the content of 25 wt %, and then uniformly mixed together. This mixture was coated with silicone-treated polyimide film to have a dry thickness of 25 μm and dried to prepare an anisotropic conductive connection film.

The above anisotropic conductive connection film was disposed between 50 μm pitch of a semiconductor device (bump size 35×80 μm, bump interval 15 μm, bump height 20 μm) and a glass substrate provided with 50 μm pitch of ITO (wire width 35 μm, wire interval 15 μm), and compressed at 190° C. under 3 kgf/cm² for 10 sec, to obtain a connection structure, which was measured for current feed characteristics and insulation characteristics. The results are given in Table 3, below.

TABLE 3

| Ex. No. | Current feed | Insulation | C. Ex. No. | Current feed | Insulation |
|---|---|---|---|---|---|
| 1 | ○ | □ | 1 | ○ | X |
| 2 | ○ | ○ | 2 | ○ | X |
| 3 | ○ | ○ | 3 | ○ | X |
| 4 | □ | ○ | 4 | ○ | X |
| 5 | ○ | ○ | 5 | ○ | X |
| 6 | ○ | ○ | 6 | ○ | X |
| 7 | ○ | ○ | 7 | ○ | X |
| 8 | ○ | ○ | 8 | ○ | X |
| 9 | ○ | ○ | 9 | ○ | X |

(Current feed Characteristics)
Rank: Criterion
○: initial resistance of connected 100 pins of 5 Ω or less
□: initial maximum resistance of connected 100 pins exceeding 5 Ω while being less than 10 Ω
X: initial maximum resistance of connected 100 pins exceeding 10 Ω
(Insulation Characteristics)
Rank: Criterion
○: resistance of non-connected 100 pins of $10^8$ Ω or more
□: minimum resistance of non-connected 100 pins of $10^6$ Ω or more
X: minimum resistance of non-connected 100 pins less than $10^6$ Ω

As apparent from Tables 1–3, in particular, Examples 1–9, the insulated conductive balls for anisotropic conductive connection coated with multi-layered water-soluble resin of the present invention have superior current feed and insulation characteristics to those of conventionally insulated conductive balls for anisotropic conductive connection coated with general resins. Further, from the results of Examples 1–9 and Comparative Examples 1–9, it can be confirmed that insulation characteristics become better when the insulating resin layer has a thickness of 10 nm or more, preferably 50 nm or more.

To test solvent resistance of the insulating resin layer, the resultant insulated conductive balls for anisotropic conductive connection were stirred in MEK solvent for 3 hours, after which surfaces thereof were observed. The insulating resin layer was not damaged.

INDUSTRIAL APPLICABILITY

As described above, the present invention provides an insulated conductive ball for anisotropic conductive connection, a preparation method thereof and a product using the same. Although the insulated conductive ball of the present invention is coated with an insulating resin, since the insulating resin layer is formed of a water-soluble resin of core/shell structure, the above insulated conductive ball can exhibit superior current feed characteristics and insulation characteristics, compared to conventional conductive balls for anisotropic conductive connection coated with thermoplastic resin or thermosetting resin.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. An insulated conductive ball for anisotropic conductive connection, comprising:
    a conductive ball; and
    an insulating resin layer coated on a surface of the conductive ball,
    wherein the insulating resin layer is formed of water-soluble resin beads, each bead having a core and shell.

2. The conductive ball according to claim 1, wherein the core comprises a copolymer of styrene and 2-ethylhexylacrylate, with a molecular weight of 100,000–1,000,000, and the shell comprises a copolymer of styrene and acrylic acid.

3. The conductive ball according to claim 2, wherein a weight ratio of styrene to 2-ethylhexylacrylate is in a range of 1:0.3–2.

4. The conductive ball according to claim 1, wherein a weight ratio of the core to the shell is in the range of 30–95:5–70.

5. The conductive ball according to claim 1, wherein the water-soluble resin beads of core and shell structures have diameters of 20-200 nm.

6. The conductive ball according to claim 1, wherein the insulating resin layer has a glass transition temperature ranging from −30 to 150° C.

7. The conductive ball according to claim 1, wherein the thickness of the insulating resin layer is not more than 1/5 of a diameter of the conductive ball while being not less than 10 nm.

8. A method of preparing an insulated conductive ball for anisotropic conductive connection, comprising:
    coating a conductive ball with a water-soluble resin of core and shell structure dissolved in water, to form an insulating resin layer on the conductive ball.

9. An anisotropic conductive connection material comprising:
    an insulating adhesive; and
    a plurality of insulated conductive balls dispersed in the insulating adhesive, each insulated conductive ball including
    a conductive ball and
    an insulating resin layer formed of water-soluble resin beads coated on a surface of the conductive ball, each bead including a core and a shell.

10. A connection structure comprising
    a first target object, a second target object to be connected to the first target object;
    an anisotropic conductive connection material disposed between the first and second target objects to connect them, the anisotropic conductive connection material including
    an insulating adhesive; and
    a plurality of insulated conductive balls dispersed in the insulating adhesive, each insulated conductive ball including
    a conductive ball and
    an insulating resin layer formed of water-soluble resin beads coated on a surface of the conductive ball, each bead including a core and a shell.

* * * * *